United States Patent
Kim et al.

(10) Patent No.: US 7,980,717 B2
(45) Date of Patent: Jul. 19, 2011

(54) LIGHT SOURCE ASSEMBLY AND LIQUID CRYSTAL DISPLAY HAVING THE SAME

(75) Inventors: Yoon-Ho Kim, Seoul (KR); Jin-Woo Park, Cheonan-si (KR); Chang-Hoi Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 273 days.

(21) Appl. No.: 12/358,794

(22) Filed: Jan. 23, 2009

(65) Prior Publication Data

US 2009/0190330 A1    Jul. 30, 2009

(30) Foreign Application Priority Data

Jan. 28, 2008    (KR) .................. 10-2008-0008736

(51) Int. Cl.
*G09F 13/08* (2006.01)
(52) U.S. Cl. ...................... 362/97.2; 362/97.1
(58) Field of Classification Search .............. 362/97.1, 362/97.2, 97.3
See application file for complete search history.

(56) References Cited

U.S. PATENT DOCUMENTS

| 2006/0262533 A1 | 11/2006 | Lin et al. | |
|---|---|---|---|
| 2007/0047220 A1* | 3/2007 | Kang et al. | 362/97 |
| 2008/0080167 A1* | 4/2008 | Chang | 362/97 |
| 2010/0079977 A1* | 4/2010 | Lee et al. | 362/97.1 |

FOREIGN PATENT DOCUMENTS

| JP | 2004266168 | 9/2004 |
|---|---|---|
| JP | 2006331801 | 12/2006 |
| KR | 1020040080626 | 9/2004 |

* cited by examiner

*Primary Examiner* — David V Bruce
(74) *Attorney, Agent, or Firm* — H.C. Park & Associates, PLC

(57) ABSTRACT

Provided is a light source assembly that may facilitate the coupling and the replacement of light source units, and may thus reduce the manufacturing time, and a liquid crystal display (LCD) having the same. The light source assembly includes a light source unit, a circuit board, and a supporting plate. The light source unit includes at least one light source chip, a first terminal connected to the light source chip, and a housing accommodating the light source chip therein and having at least one fixing protrusion on one side thereof. The circuit board includes a second terminal that is connected to the first terminal and transmits a driving voltage. The light source unit is mounted on the second terminal. The supporting plate is disposed on the circuit board and includes an opening into which the light source unit is inserted. At least a portion of the housing is fixed to the circuit board through the opening.

20 Claims, 7 Drawing Sheets

LIGHT SOURCE ASSEMBLY AND LIQUID CRYSTAL DISPLAY HAVING THE SAME

CROSS-REFERENCE TO RELATED APPLICATION

This application claims priority from and the benefit of Korean Patent Application No. 10-2008-0008736, filed on Jan. 28, 2008, which is hereby incorporated by reference for all purposes as if fully set forth herein.

BACKGROUND OF THE INVENTION

1. Field of the Invention

The present invention relates to a light source assembly and a liquid crystal display (LCD) having the same, and more particularly, to a light source assembly that may facilitate the coupling and the replacement of light source units and may thus have a reduced manufacturing time, and an LCD having the same.

2. Discussion of the Background

In recent years, there has been a dramatic increase in the demand for flat panel display devices, such as plasma display panel (PDP) devices, plasma-addressed liquid crystal (PALC) display panel devices, liquid crystal display (LCD) devices, and organic light-emitting diode (OLED) devices, since conventional cathode ray tube (CRT) devices have been unable to meet the demand for thin and large-scale display devices.

As one of the most widely used flat panel display devices, an LCD typically includes two display panels with field-generating electrodes, such as pixel and common electrodes, mounted thereon, and a liquid crystal layer disposed between the two display panels. The alignment of liquid crystal molecules in a liquid crystal layer of an LCD may be altered, thereby adjusting the transmittance of the liquid crystal layer and displaying an image.

Generally, LCDs display images through liquid crystal molecules having transmittance that varies according to the direction and the intensity of an electric field, with light provided from a backlight assembly. Various light sources such as a cold cathode fluorescent lamp (CCFL), an external electrode fluorescent lamp (EEFL), or a light emitting diode (LED) may be used in the backlight assembly. In particular, LEDs have been widely used due to their low power consumption and high luminance.

However, in order to uniformly distribute light over the entire surface of a liquid crystal panel, the luminance of LEDs must be uniformly maintained. Thus, LEDs may be connected in series to minimize deviations in the amount of current supplied to the LEDs.

If one of the LEDs connected in series becomes defective, the defective LED may adversely affect non-defective LEDs. Therefore, the defective LED should be replaced immediately. However, in the case of a conventional light source assembly having LEDs mounted on a circuit board, it may be difficult to readily replace individual LEDs, and the task may require a considerable amount of time to perform.

SUMMARY OF THE INVENTION

The present invention provides a light source assembly that may facilitate the coupling and the replacement of light source units and may thus have a reduced manufacturing time.

The present invention also provides a liquid crystal display (LCD) including the light source assembly.

Additional features of the invention will be set forth in the description which follows, and in part will be apparent from the description, or may be learned by practice of the invention.

The present invention discloses a light source assembly including a light source unit, a circuit board, and a supporting plate. The light source unit includes at least one light source chip, a first terminal connected to the light source chip, and a housing accommodating the light source chip therein and having at least one fixing protrusion disposed on one side thereof. The circuit board includes a second terminal that is connected to the first terminal and that transmits a driving voltage. The light source unit is mounted on the second terminal. The supporting plate is disposed on the circuit board and includes an opening into which the light source unit is inserted. At least a portion of the housing is fixed to the circuit board through the opening.

The present invention also discloses an LCD including a liquid crystal panel to display an image and a light source assembly to provide light to the liquid crystal panel. The light source assembly includes a light source unit, a circuit board on which the light source unit is mounted, and a supporting plate disposed on the circuit board. The light source unit includes at least one light source chip, a first terminal connected to the light source chip, and a housing accommodating the light source chip therein and having at least one fixing protrusion disposed on one side thereof. The circuit board includes a second terminal that is connected to the first terminal and that transmits a driving voltage, and the supporting plate includes an opening into which the light source unit is inserted. At least a portion of the housing is fixed to the circuit board through the opening.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
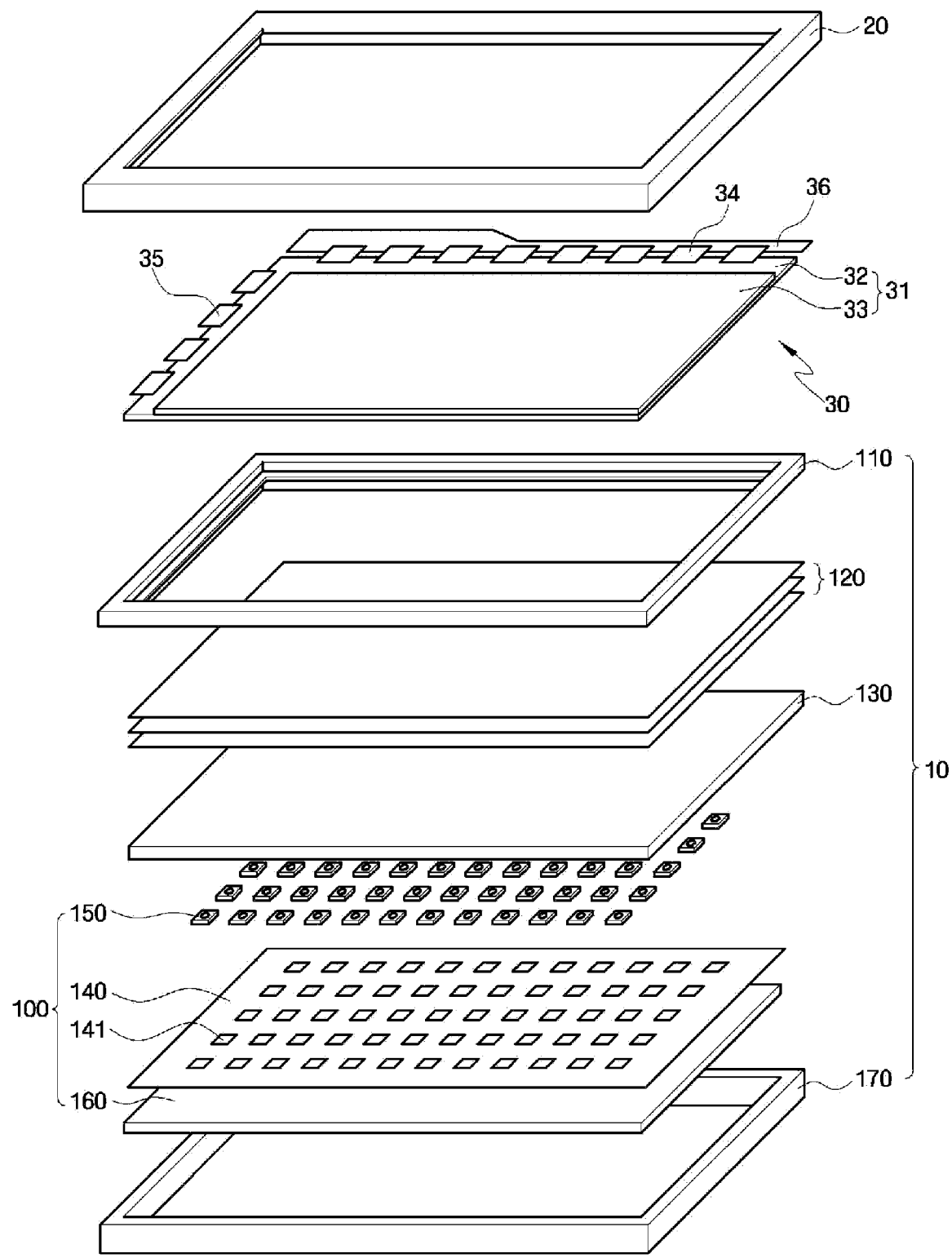
FIG. 1 shows an exploded perspective view of a liquid crystal display (LCD) according to an exemplary embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout. As used herein the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Furthermore, relative terms such as "below," "beneath," "lower," "above," and "upper" may be used herein to describe one element's relationship to another element as illustrated in the accompanying drawings. It will be understood that relative terms are intended to encompass different orientations of the device in addition to the orientation depicted in the accompanying drawings. For example, if the device in the accompanying drawings is turned over, elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the exemplary terms "below" and "beneath" can therefore encompass both an orientation of above and below.

A liquid crystal display (LCD) according to an exemplary embodiment of the present invention will hereinafter be described in detail with reference to FIG. 1. FIG. 1 shows an exploded perspective view of an LCD 1 according to an exemplary embodiment of the present invention. Referring to FIG. 1, the LCD 1 includes a liquid crystal panel assembly 30, an upper container 20, and a backlight assembly 10.

The liquid crystal panel assembly 30 includes a liquid crystal panel 31, a plurality of gate tape carrier packages (TCPs) 35, a plurality of data TCPs 34, and an integrated printed circuit board (PCB) 36. The liquid crystal panel 31 includes a thin film transistor (TFT) display panel 32, a common electrode display panel 33, and a liquid crystal layer (not shown) disposed between the TFT display panel 32 and the common electrode display panel 33.

The TFT display panel 32 includes a plurality of gate lines (not shown), a plurality of data lines (not shown), a TFT array (not shown), and a plurality of pixel electrodes (not shown). The common electrode display panel 33 includes a plurality of black matrices (not shown) and a common electrode (not shown) and faces the TFT display panel 32. The liquid crystal panel 31 displays image data.

The gate TCPs 35 are connected to the gate lines on the TFT display panel 32, and the data TCPs 34 are connected to the data lines on the TFT display panel 32. The gate TCPs 35 and the data TCPs 34 may include tape automated bonding (TAB) tapes, which connect a semiconductor chip to wiring patterns on a base film. Not only TCPs, but also chip-on-films (COFs) may be used as chip film packages, but exemplary embodiments of the present invention are not restricted to this.

Various driving elements to apply a gate driving signal to the gate TCPs 35 and to apply a data driving signal to the data TCPs 34 are mounted on the PCB 36.

The upper container 20 forms the exterior of the LCD 1. The upper container 20 has an empty space therein and can thus accommodate the liquid crystal panel assembly 30 therein. An open window is formed in the middle of the upper container 20 and exposes the liquid crystal panel 31.

The upper container 20 is coupled to a lower container 170 with a middle frame 110 disposed therebetween.

The backlight assembly 10 includes the middle frame 110, a plurality of optical sheets 120, a diffusion plate 130, a light source assembly 100, and the lower container 170.

The middle frame 110 accommodates the optical sheets 120, the diffusion plate 130, and the light source assembly 100 therein and is settled in the lower container 170. The middle frame 110 includes a plurality of sidewalls that form the outline of a rectangle. An open window is formed in the middle of the middle frame 110 so that light can be transmitted not only through the diffusion plate 130 and the optical sheets 120, but also through the middle frame 110.

The optical sheets 120 diffuse and collect light transmitted by the diffusion plate 130. The optical sheets 120 are disposed on the diffusion plate 130 and are contained in the middle frame 110. The optical sheets 120 include first and second prism sheets and a protective sheet.

The first and second prism sheets refract light passing through the diffusion plate 130 and can thus focus light incident thereupon at low angles, which may improve the brightness of the LCD 1 within a specific viewing angle range.

The protective sheet is disposed on the first and second prism sheets and protects the first and second prism sheets. Also, the protective sheet diffuses light, which may provide a uniform distribution of light. The structure of the optical sheets 120 is not restricted to that set forth herein. Rather, the structure of the optical sheets 120 may vary from one LCD to another.

The diffusion plate 130 diffuses light emitted from the light source assembly 100 in various directions. The diffusion plate 130 may prevents spot, which are bright areas that appear around point light sources, from being visible from the front of the LCD 1.

The light source assembly 100 is a light-emitting device that provides light to the diffusion plate 130. The light source assembly 100 includes a plurality of light source units 150, a circuit board 160, and a supporting plate 140. The light source units 150 are minimal units for generating white light. The light source units 150 are connected to the circuit board 160 and thus receive a driving voltage. The light source units 150 are disposed on the circuit board 160, and the supporting plate 140 is disposed on the circuit board 160, thereby fixing the light source units 150 onto the circuit board 160.

The supporting plate 140 includes a plurality of openings 141, through which the light sources 150 are respectively exposed. The supporting plate 140 transmits light therethrough and fixes the light source units 150 onto the circuit board 160.

Figure 2:
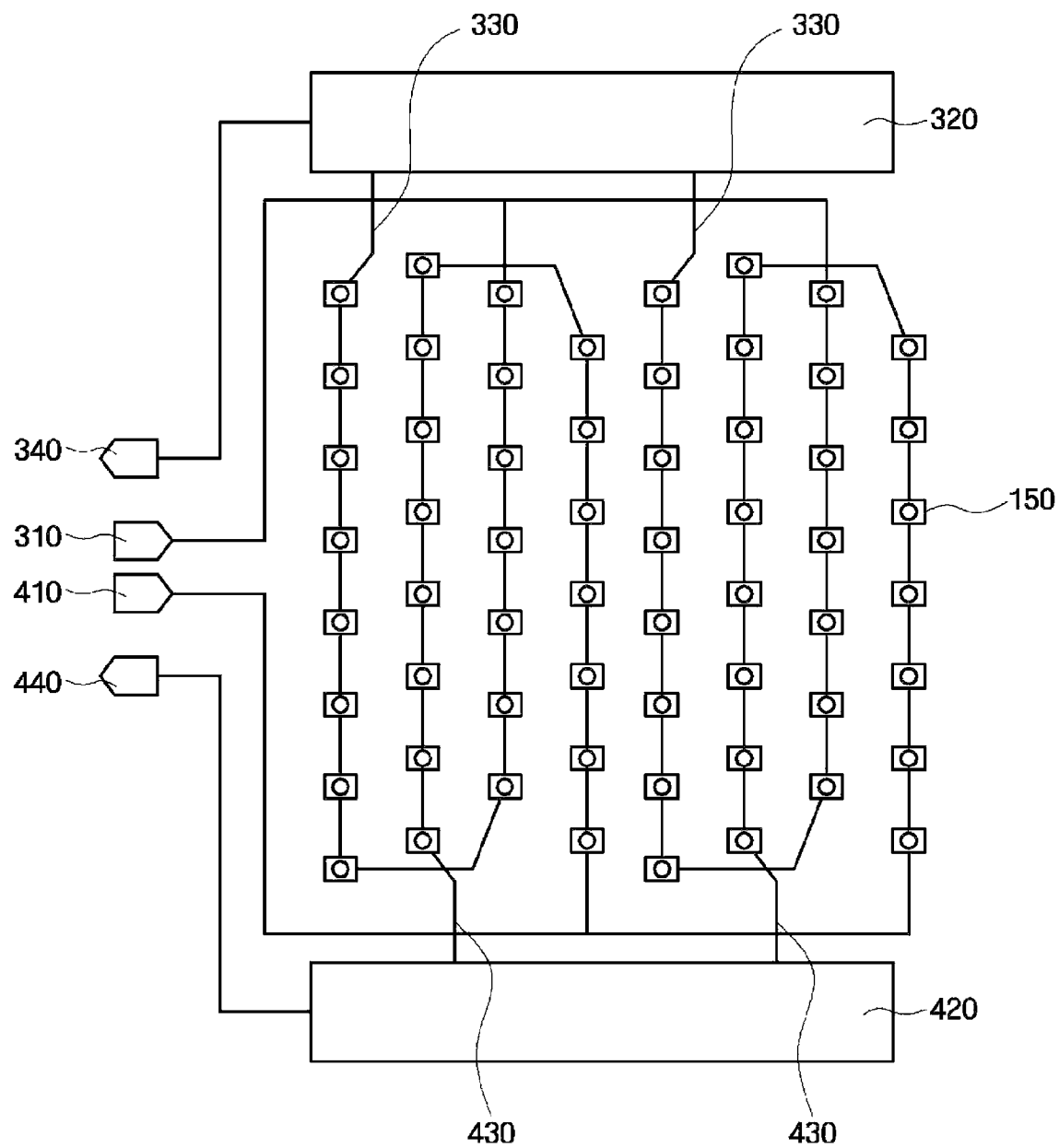
FIG. 2 shows a schematic diagram of a light source unit shown in FIG. 1.

A light source assembly according to an exemplary embodiment of the present invention will hereinafter be described in detail with reference to FIG. 1 and FIG. 2. FIG. 2 shows a schematic diagram of circuitry for driving the liquid crystal panel 31 shown in FIG. 1.

Referring to FIG. 2, a plurality of light source units 150 are arranged at regular intervals, and may uniformly provide light to the liquid crystal panel assembly 31. More specifically, the circuitry for driving the liquid crystal panel 31 may include a first power input terminal 310, a second voltage input terminal 410, a first adjustment circuit 320, a second adjustment circuit 420, a plurality of first light source unit strings 330, a plurality of second light source unit strings 430, a first voltage feedback terminal 340, and a second voltage feedback terminal 440.

The light source units 150 are connected in series to one another, thereby forming the first light source unit strings 330 and the second light source unit strings 430. Each first light source unit string 330 may be connected in parallel to the first voltage input terminal 310 and the first voltage feedback terminal 340. The second light source unit strings 430 may be connected in parallel to the second voltage input terminal 410 and the second voltage feedback terminal 440.

In order to minimize current deviations among the light source units 150, the light source units 150 may all be connected in series to one another. However, if a considerable amount of light source units 150 are all connected in series to one another, a very high driving voltage may be necessary for driving the light source units 150. Therefore, the light source units 150 may be divided into one or more groups, and the light source units 150 in each group may be connected in series to one another, thereby forming a plurality of light source unit strings. Then, the light source unit strings may be connected in parallel to one another.

The phase of a driving voltage applied to the first light source unit strings 330 may be different from the phase of a driving voltage applied to the second light source unit strings 430. If the light source units 150 are LEDs and a pulse-type input signal is applied to the light source units 150, each light source unit 150 may output a pulse-type feedback signal. In this case, the operation of the TFTs on the liquid crystal panel 31 may be affected by a variation in the level of the pulse-type feedback signal output by each light source unit 150. In order to reduce a variation in the level of the pulse-type feedback signal output by each light source unit 150, driving voltages having different phases may be applied to the first light source unit strings 330 and the second light source unit strings 430, respectively. The two driving voltages having different phases may offset a variation in the level of a pulse-type feedback signal, thereby enabling the TFTs on the liquid crystal panel 31 to stably operate.

More specifically, a first driving voltage may be applied to the first light source unit strings 330 through the first voltage input terminal 310, and a second driving voltage may be applied to the second light source unit strings 430 through the second voltage input terminal 410. The first light source unit strings 330 are connected in parallel to each other and are connected to the first voltage input terminal 310. The second light source unit strings 430 are connected in parallel to each other and are connected to the second voltage input terminal 410.

The first adjustment circuit 320 may be connected between the first voltage feedback terminal 340 and the first light source unit strings 330. The first adjustment circuit 320, to which the first light source unit strings 330 are all connected, may adjust current deviations between the first light source unit strings 330 and thus enable the light source units 150 to uniformly emit light. Likewise, the second adjustment circuit 420 may be connected between the second voltage feedback terminal 440 and the second light source unit strings 430. The second adjustment circuit 420 may adjust the amount of current supplied to each second light source unit string 430.

Figure 3:
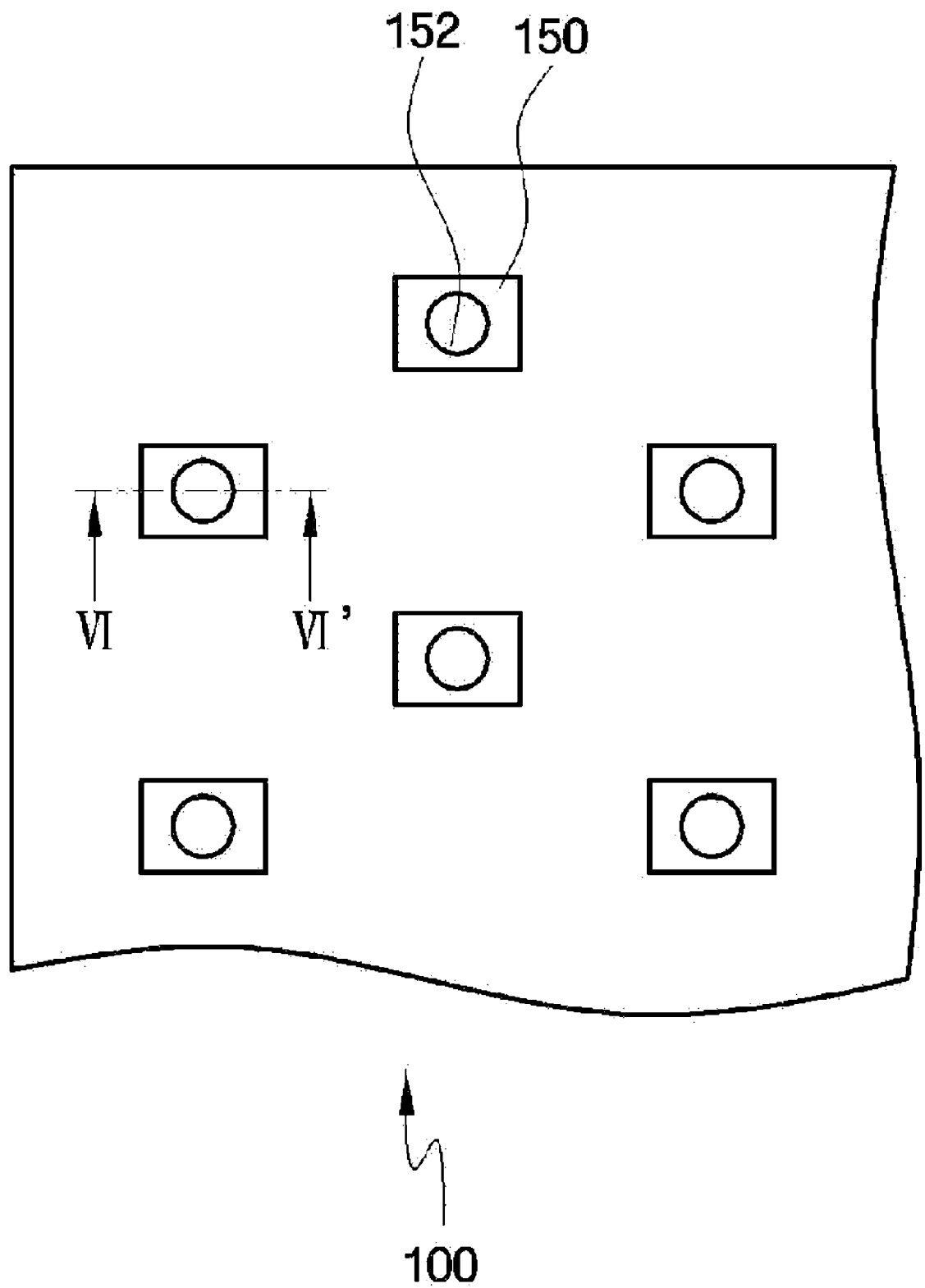
FIG. 3 shows a partial plan view of a light source assembly shown in FIG. 1.

The structure of the light source assembly 100 shown in FIG. 1 will hereinafter be described in further detail with reference to FIG. 3, FIG. 4, FIG. 5, and FIG. 6. FIG. 3 shows a partial plan view of the light source assembly 100 shown in FIG. 1, FIG. 4 shows a partial exploded perspective view of the light source assembly 100 shown in FIG. 3, FIG. 5 shows a bottom perspective view of the light source assembly 100 shown in FIG. 4, and FIG. 6 shows a cross-sectional view taken along line VI-VI' of FIG. 3.

Referring to FIG. 3, the light source assembly 100 includes a plurality of light source units 150 that each include a protective layer 152.

The light source units 150 are point light sources that emit white light.

Figure 4:
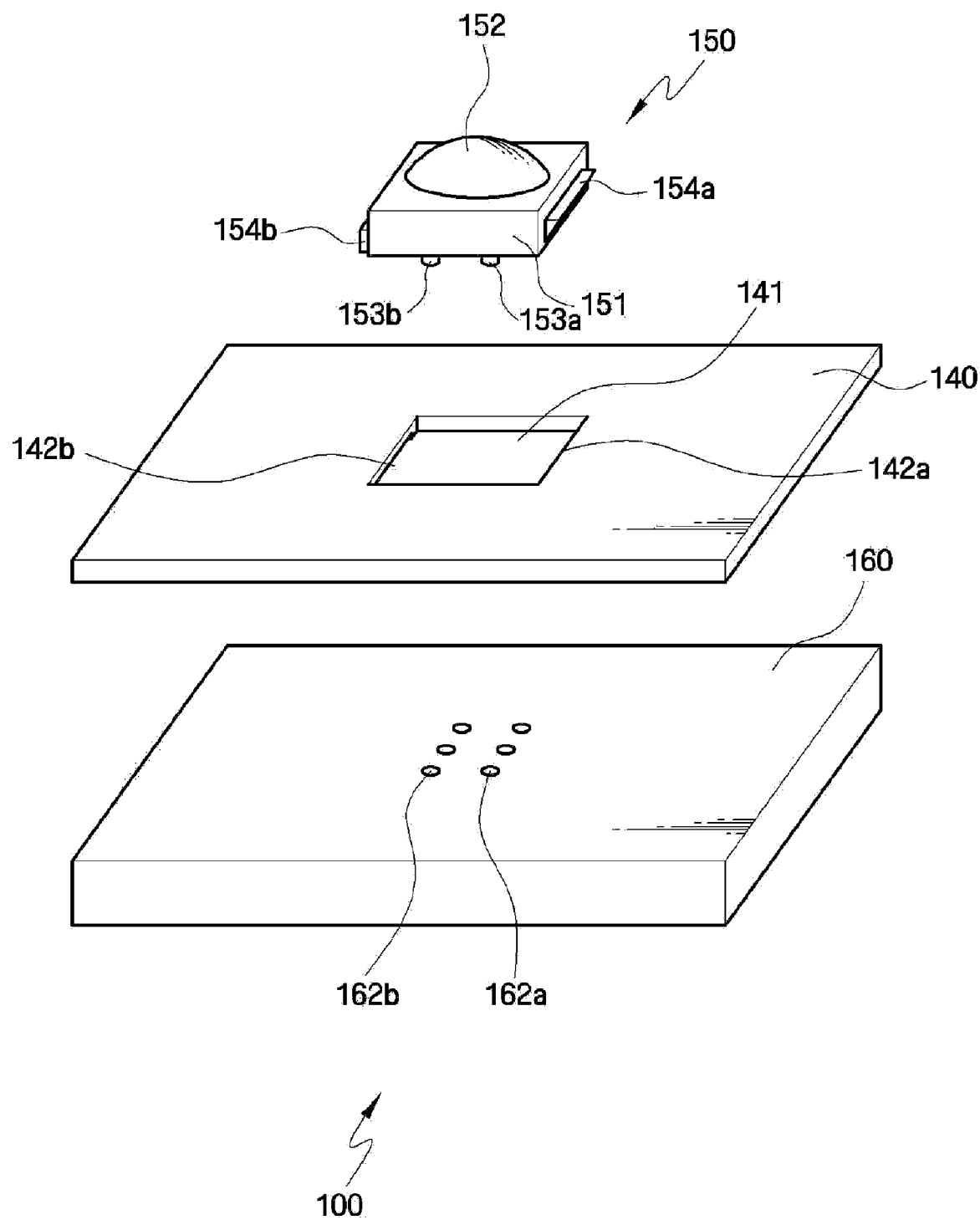
FIG. 4 shows a partial exploded perspective view of the light source assembly shown in FIG. 3.
Figure 5:
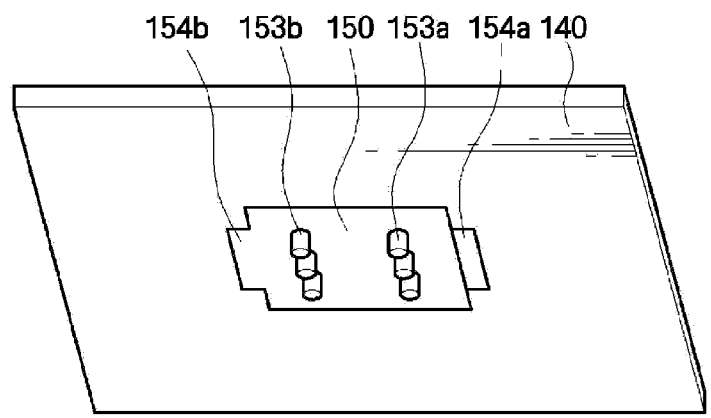
FIG. 5 shows a bottom perspective view of the light source assembly shown in FIG. 4.
Figure 6:
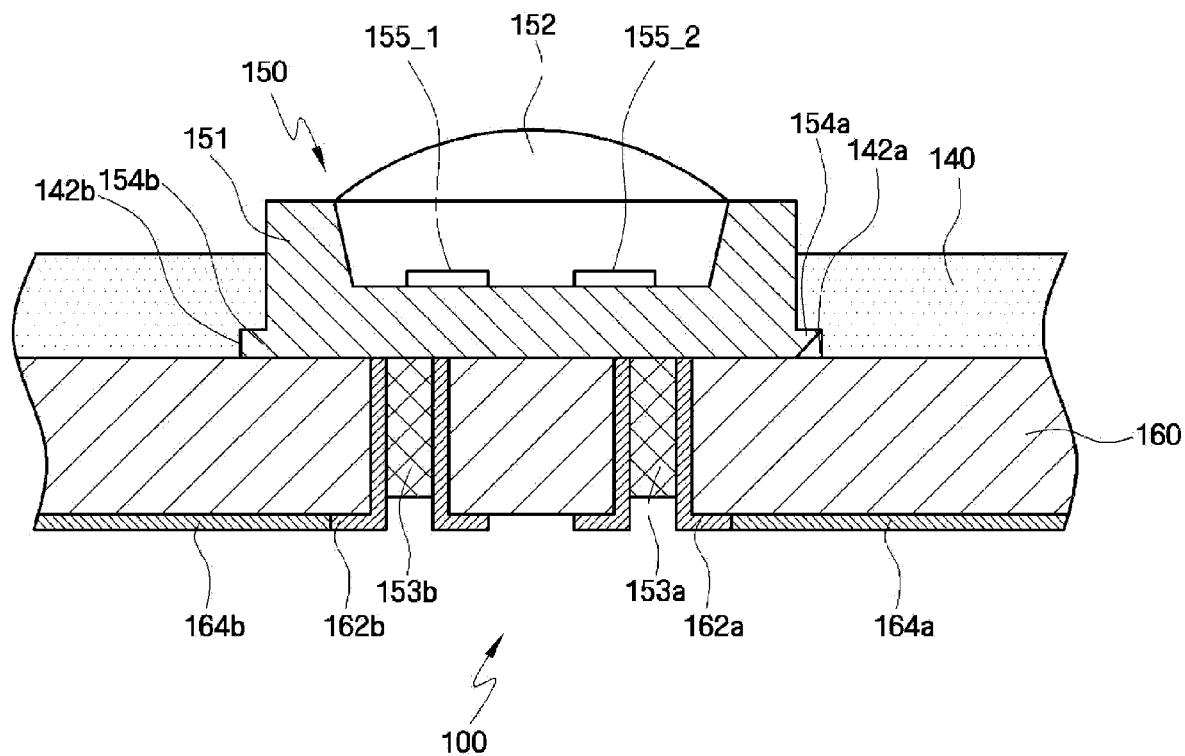
FIG. 6 shows a cross-sectional view taken along line VI-VI' of FIG. 3.

Referring to FIG. 4, FIG. 5, and FIG. 6, a light source unit 150 includes light source chips 155_1 and 155_2, a housing 151, first terminals 153a and 153b, first and second fixing protrusions 154a and 154b, and a protective layer 152.

The light source chips 155_1 and 155_2 emit red light, green light, and blue light. The red light, the green light, and the blue light are mixed, thereby generating white light. The light source chips 155_1 and 155_2 may be connected to the first terminals 153a and 153b and may thus receive a driving voltage. The light source chips 155_1 and 155_2 may be installed in the housing 151 and may thus constitute the light source unit 150 along with the housing 151. The light source chips 155_1 and 155_2 may not necessarily emit all of red light, green light, and blue light. Instead, the light source chips 155_1 and 155_2 may emit only one or two of red light, green light, and blue light. In this case, the color of the protective layer 152 may be appropriately adjusted so that the light source unit 150 can emit white light.

The protective layer 152 may be disposed above the light source chips 155_1 and 155_2, which are installed in the housing 151, and may thus protect the light source chips 155_1 and 155_2. The protective layer 152 may be made of a transparent material having high transmittance as a dome, and may thus serve the functions of a lens.

The first terminals 153a and 153b may be disposed under the housing 151. The first terminals 153a and 153b are connected to the light source chips 155_1 and 155_2 and provide a driving voltage to the light source chips 155_1 and 155_2. Two first terminals may be provided for each light source chip 155_1 and 155_2. The first terminals 153a and 153b may include all terminals for applying a driving voltage to the light source chips 155_1 and 155_2. For example, the first terminals 153a and 153b may include both a cathode and an anode. The first terminals 153a and 153b may be pins. If a plurality of second terminals 162a and 162b are formed in the circuit board 160 as holes, the first terminals 153a and 153b and the second terminals 162a and 162b may also be used as fixing elements.

The first and second fixing protrusions 154a and 154b are disposed on both sides of the housing 151. The first and second fixing protrusions 154a and 154b may be hook-coupled to the supporting plate 140 and may thus fix the light source unit 150. More specifically, the first and second fixing protrusions 154a and 154b may be disposed on opposite sides of the housing 151. The first fixing protrusion 154a may have a surface inclined toward the circuit board 160 and may thus enable the light source unit 150 to be inserted into an opening 141 of the supporting plate 140. If pressure is applied to the light source unit 150 when the light source unit 150 is inserted into the opening 141 of the supporting plate 140, the first fixing protrusion 154a may be hook-coupled to an edge of the opening 141. The second fixing protrusion 154b may not necessarily have an inclined bottom surface because the light source unit 150 may be easily coupled to the supporting plate 140 by inserting the second fixing protrusion 154b into a second fixing groove 142b and then inserting the first fixing protrusion 154a into a first fixing groove 142a. The first fixing protrusion 154a may have an inclined bottom surface, and thus, the thickness of the first fixing protrusion 154a may become smaller, more distant from the housing 151. The first fixing protrusion 154a may have elasticity and may thus be able to recover its original size and shape after the removal of stress causing deformation. Therefore, the light source unit 150 may be easily inserted into the opening 141 because the first fixing protrusion 154a has a bottom surface that is inclined. In addition, the first light source unit 150 may be easily detached from the supporting plate 140 because the first fixing protrusion 154a may be easily deformed by applying force and can be returned to its original state immediately after the removal of the force. The light source unit 150 may be disposed on the circuit board 160. More specifically, a plurality of light source units 150 may be arranged on the circuit board 160 at regular intervals, thereby forming a surface light source. The circuit board 160 may include the second terminals 162a and 162b, which can be coupled to the first terminals 153a and 153b. The second terminals 162a and 162b may include all terminals for applying a driving voltage to the first terminals 153a and 153b. For example, the second terminals 162a and 162b may include both an anode and a cathode. The second terminals 162a and 162b may be holes. For example, a plurality of holes may be formed through the circuit board 160, and the surroundings of each hole may be plated with a conductive material. Thus, the second terminals 162a and 162b may apply a driving voltage to the first terminals 153a and 153b and fix the first terminals 153a and 153b by being coupled to the first terminals 153a and 153b. Wiring patterns 164a and 164b may be disposed on the circuit board 160. The wiring patterns 164a and 164b apply a driving voltage to the second terminals 162a and 162b.

The supporting plate 140 fixes the light source unit 150. The supporting plate 140 may be coated with a reflective material and may thus serve as a reflective plate. The supporting plate 140 includes the opening 141, through which the light source unit 150 is exposed. When the light source unit 150 is inserted into the opening 141, the housing 151 is fixed to the circuit board 160 through the opening 141. The supporting plate 140 includes the first and second fixing grooves 142a and 142b. The first and second fixing protrusions 154a and 154b of the light source unit 150 may be coupled to the first and second fixing grooves 142a and 142b, respectively. The first and second fixing grooves 142a and 142b may be disposed at the bottom of the supporting plate 140. The first and second fixing grooves 142a and 142b may be disposed on both sides of the opening 141. The size of the first and second fixing grooves 142a and 142b may be determined so that no empty space can be generated between the supporting plate 140 and the circuit board 160 when the first and second fixing protrusions 154a and 154b are inserted into the first and second fixing grooves 142a and 142b, respectively.

The supporting plate 140 and the circuit board 160 may be coupled to each other by additional coupling elements such as hooks or screws.

Figure 7:
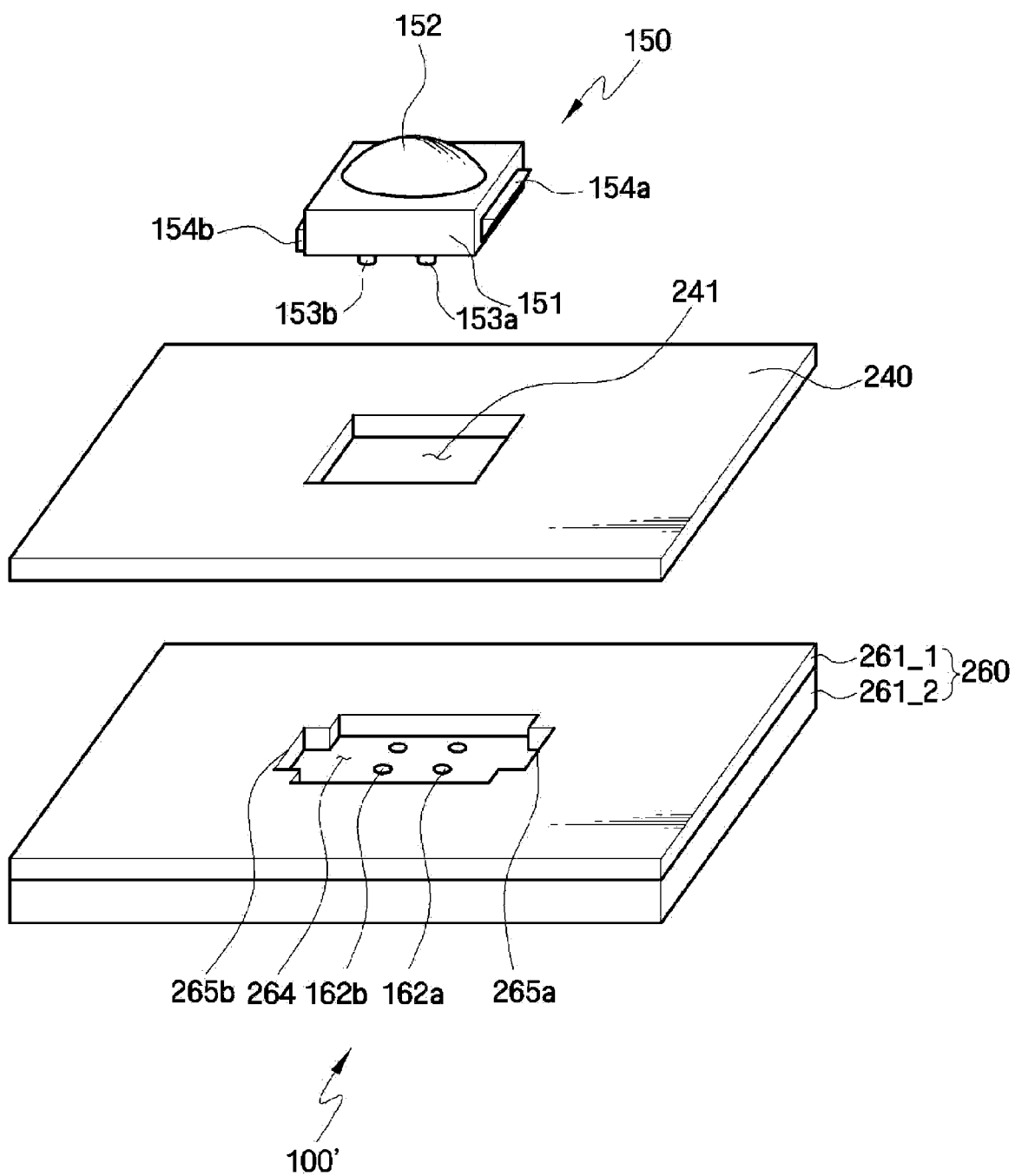
FIG. 7 shows an exploded perspective view of a light source assembly according to another exemplary embodiment of the present invention.
Figure 8:
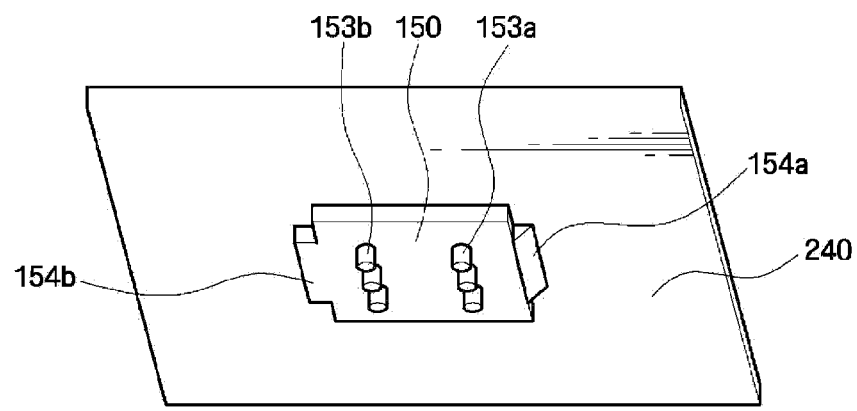
FIG. 8 shows a bottom perspective view of a light source unit and a supporting plate in the light source assembly shown in FIG. 7.
Figure 9:
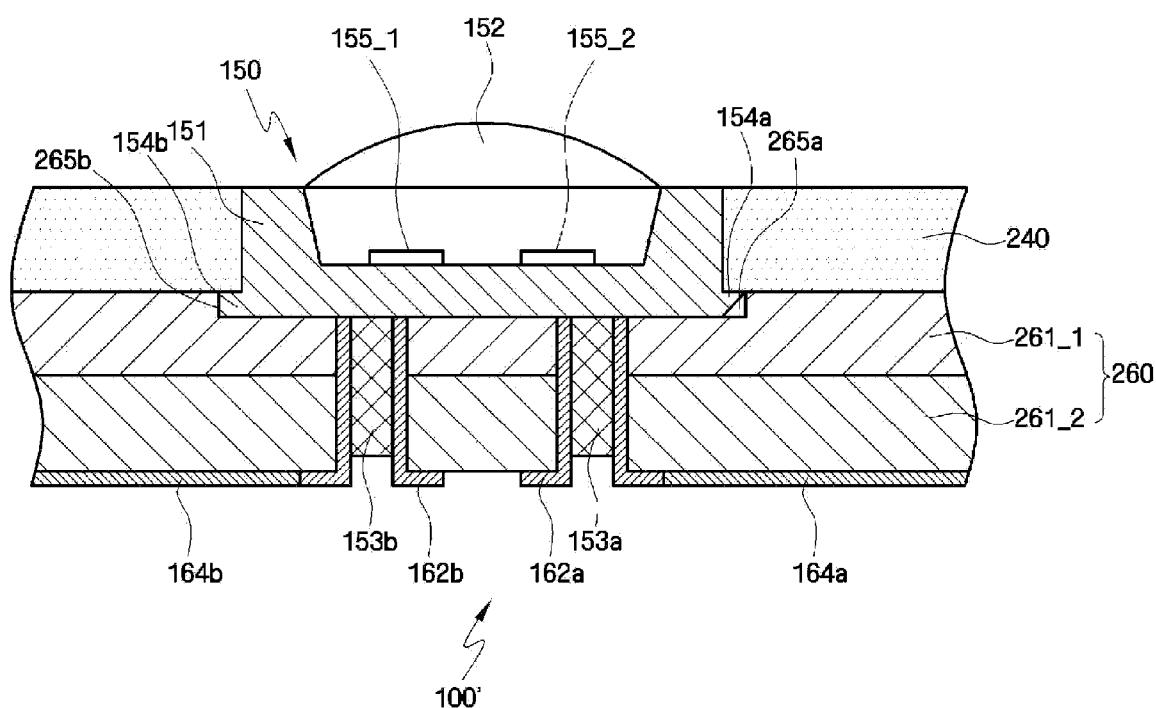
FIG. 9 shows a cross-sectional view of the light source assembly shown in FIG. 7.

A light source assembly according to another exemplary embodiment of the present invention will hereinafter be described in detail with reference to FIG. 7, FIG. 8, and FIG. 9. FIG. 7 shows a partial exploded perspective view of a light source assembly 100' according to another exemplary embodiment of the present invention, FIG. 8 shows a bottom perspective view of the light source assembly 100' shown in FIG. 7, and FIG. 9 shows a cross-sectional view of the light source assembly shown in FIG. 7. In FIG. 1, FIG. 2, FIG. 3, FIG. 4, FIG. 5, FIG. 6, FIG. 7, FIG. 8, and FIG. 9, like reference numerals indicate like elements, and thus, detailed descriptions thereof will be skipped.

Referring to FIG. 7, FIG. 8, and FIG. 9, the light source assembly 100' includes a circuit board 260, which includes first and second fixing grooves 265a and 265b. The circuit board 260 may include a plurality of sub-circuit boards and may thus have a multilayer structure. More specifically, the circuit board 260 may include upper and lower sub-circuit boards 261_1 and 261_2. In order to effectively apply a driving voltage to a light source unit 150, wiring patterns 164a and 164b may have a multilayer structure. The upper sub-circuit board 261_1 may include an indentation 264.

The size of the indentation 264 may be determined so that the light source unit 150 can be inserted into the indentation 264. The upper sub-circuit board 261_1 may also include the first and second fixing grooves 265a and 265b. First and second fixing protrusions 154a and 154b may be inserted into the first and second fixing grooves 265a and 265b, respectively, when the light source unit 150 is inserted into the indentation 264. The first and second fixing grooves 265a and 265b may provide space for accommodating and fixing the first and second fixing protrusions 154a and 154b therein along with the supporting plate 240. The indentation 264 may be formed during the formation of the upper sub-circuit board 261_1 on the lower sub-circuit board 261_2. That is, the indentation 264 may be formed by depositing a resin layer for forming the upper sub-circuit board 261_1 on the lower sub-circuit board 261_2, laying a mold having the same shape as that of the indentation 264 over the resin layer, and applying pressure to the mold.

Alternatively, the indentation 264 may be formed by forming an opening having the same shape as that of the opening 150 through the upper sub-circuit board 261_1, depositing the upper sub-circuit board 261_1 on the lower sub-circuit board 261_2, and applying pressure to the upper sub-circuit board 261_1.

The supporting plate 240 may include an opening 241, through which the light source unit 150 is exposed. The supporting plate 240 may be disposed on the circuit board 260. The supporting plate 240 and the circuit board 260 may be fixed to each other so that no empty space exists between the supporting plate 240 and the circuit board 260.

The first and second fixing protrusions 154a and 154b of the light source unit 150 may be inserted into the indentation 264 of the circuit board 260, and the first and second protrusions 154a and 154b may be hook-coupled to the supporting plate 240.

Second terminals 162a and 162b may be formed in the lower sub-circuit board 261_2 and exposed by the indentation 264 of the upper sub-circuit board 261_1.

As described above, according to exemplary embodiments of the present invention, it may be possible to facilitate the coupling and the replacement of light source units and thus shorten the time required to manufacture a light source assembly.

In addition, according to exemplary embodiments of the present invention, it may be possible to facilitate the return of a light source assembly having defective light source units to the manufacturing process by replacing the defective light source units in a short period of time.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light source assembly, comprising:
a light source unit comprising at least one light source chip, a first terminal connected to the light source chip, and a housing accommodating the light source chip therein and having at least one fixing protrusion on one side thereof;
a circuit board comprising a second terminal to transmit a driving voltage, the second terminal being connected to the first terminal, the light source unit being mounted on the second terminal; and
a supporting plate disposed on the circuit board and comprising an opening into which the light source unit is inserted,
wherein at least a portion of the housing is fixed to the circuit board through the opening.

2. The light source assembly of claim 1, further comprising at least one fixing groove arranged at an edge of the opening and into which the fixing protrusion is inserted.

3. The light source assembly of claim 1, wherein the fixing protrusion has a surface inclined toward the circuit board.

4. The light source assembly of claim 1, wherein the first terminal is a pin and the second terminal is a hole into which the first terminal can be inserted.

5. The light source assembly of claim 1, wherein a top surface of the supporting plate is coated with a reflective material.

6. The light source assembly of claim 1, further comprising a plurality of light source unit strings, each light source unit string comprising a plurality of light source units connected in series to one another,
wherein the light source unit strings comprise one or more first light source unit strings that receive a first driving voltage and one or more second light source strings that receive a second driving voltage having a different phase than the first driving voltage.

7. The light source assembly of claim 6, wherein the first light source unit strings are connected in parallel to each other and are connected to a first voltage input terminal, and the second light source unit strings are connected in parallel to each other and are connected to a second voltage input terminal.

8. The light source assembly of claim 1, wherein the circuit board further comprises an indentation on one surface of the circuit board into which the light source unit is inserted.

9. The light source assembly of claim 8, wherein the indentation comprises a fixing groove into which the fixing protrusion is inserted.

10. The light source assembly of claim 1, wherein the circuit board has a multilayer structure comprising a plurality of sub-circuit boards.

11. A light crystal display (LCD), comprising:
a liquid crystal panel to display an image; and
a light source assembly to provide light to the liquid crystal panel and comprising a light source unit, a circuit board on which the light source unit is mounted, and a supporting plate disposed on the circuit board,
wherein the light source unit comprises at least one light source chip, a first terminal connected to the light source chip, and a housing accommodating the light source chip therein and having at least one fixing protrusion on one side thereof,
wherein the circuit board comprises a second terminal to transmit a driving voltage, the second terminal being connected to the first terminal,
wherein the supporting plate comprises an opening into which the light source unit is inserted, and
wherein at least a portion of the housing is fixed to the circuit board through the opening.

12. The LCD of claim 11, further comprising at least one fixing groove at an edge of the opening and into which the fixing protrusion is inserted.

13. The LCD of claim 11, wherein the fixing protrusion has a surface inclined toward the circuit board.

14. The LCD of claim 11, wherein the first terminal is a pin and the second terminal is a hole into which the first terminal can be inserted.

15. The LCD of claim 11, further comprising a coupling element to couple the supporting plate to the circuit board.

16. The LCD of claim 11, wherein a top surface of the supporting plate is coated with a reflective material.

17. The LCD of claim 11, wherein the light source assembly further comprises a plurality of light source unit strings, each light source unit string comprising a plurality of light source units connected in series to one another,
wherein the light source unit strings comprise one or more first light source unit strings to receive a first driving voltage and one or more second light source strings to receive a second driving voltage having a different phase than the first driving voltage.

18. The LCD of claim 17, wherein the first light source unit strings are connected in parallel to each other and are connected to a first voltage input terminal, and
wherein the second light source unit strings are connected in parallel to each other and are connected to a second voltage input terminal.

19. The LCD of claim 11, wherein the circuit board further comprises an indentation on one surface of the circuit board into which the light source unit is inserted.

20. The LCD of claim 11, wherein the circuit board has a multilayer structure comprising a plurality of sub-circuit boards.

* * * * *